United States Patent
Kondou et al.

(10) Patent No.: US 8,138,842 B2
(45) Date of Patent: Mar. 20, 2012

(54) PLL FREQUENCY SYNTHESIZER

(75) Inventors: Masafumi Kondou, Kawasaki (JP);
Toshihiko Mori, Kawasaki (JP)

(73) Assignee: Fujitsu Limited, Kasawaki (JP)

( * ) Notice: Subject to any disclaimer, the term of this patent is extended or adjusted under 35 U.S.C. 154(b) by 23 days.

(21) Appl. No.: 12/560,118

(22) Filed: Sep. 15, 2009

(65) Prior Publication Data
US 2010/0007425 A1    Jan. 14, 2010

Related U.S. Application Data

(63) Continuation of application No. PCT/JP2007/000244, filed on Mar. 16, 2007.

(51) Int. Cl.
*H03L 7/00* (2006.01)

(52) U.S. Cl. .......... 331/16; 331/34; 331/36 C; 331/1 R; 331/177 R; 331/179; 375/376

(58) Field of Classification Search .............. 331/16, 331/34, 36 C, 1 R, 177 R, 179; 375/376
See application file for complete search history.

(56) References Cited

U.S. PATENT DOCUMENTS

| | | | |
|---|---|---|---|
| 5,534,823 A | 7/1996 | Kondou | |
| 6,229,363 B1 | 5/2001 | Eto et al. | |
| 6,563,387 B2 | 5/2003 | Hirano et al. | |
| 6,614,319 B2 | 9/2003 | Saeki et al. | |
| 7,301,416 B2 * | 11/2007 | Yamamoto et al. | 331/179 |
| 7,501,868 B2 * | 3/2009 | Ito | 327/158 |
| 2001/0052823 A1 | 12/2001 | Hirano et al. | |
| 2002/0033738 A1 | 3/2002 | Saeki et al. | |
| 2003/0112079 A1 | 6/2003 | Saeki et al. | |
| 2004/0162047 A1 | 8/2004 | Kasahara et al. | |
| 2005/0068111 A1 | 3/2005 | Kasahara et al. | |
| 2005/0237119 A1* | 10/2005 | Irie | 331/16 |
| 2006/0267699 A1* | 11/2006 | Uozumi et al. | 331/17 |
| 2009/0091396 A1* | 4/2009 | Jian et al. | 331/16 |

FOREIGN PATENT DOCUMENTS

| | | |
|---|---|---|
| JP | 7-288471 A | 10/1995 |
| JP | 11-316618 A | 11/1999 |
| JP | 2001-237699 A | 8/2001 |
| JP | 2001-339301 A | 12/2001 |
| JP | 2002-57578 | 2/2002 |
| JP | 2003-152535 A | 5/2003 |

* cited by examiner

*Primary Examiner* — Arnold Kinkead
*Assistant Examiner* — Richard Tan
(74) *Attorney, Agent, or Firm* — Arent Fox LLP

(57) ABSTRACT

A frequency synthesizer includes a voltage-controlled oscillator, a frequency range tuning circuit which detects a frequency control code that sets a voltage-controlled frequency range of the voltage-controlled oscillator corresponding to the frequency division ratio which is variably-set, and a frequency control code memory which stores the frequency control code detected by the frequency range tuning circuit corresponding to the frequency division ratio. In an initialization interval, the frequency range tuning circuit detects the frequency control code corresponding to the frequency division ratio which is variably-set, and the frequency control code memory stores the frequency control code which is detected. In a normal operation interval, in response to the frequency selection signal, the frequency control code, which is stored in the frequency control code memory and corresponds to the frequency division ratio which is variably-set, is output to the voltage-controlled oscillator.

11 Claims, 17 Drawing Sheets

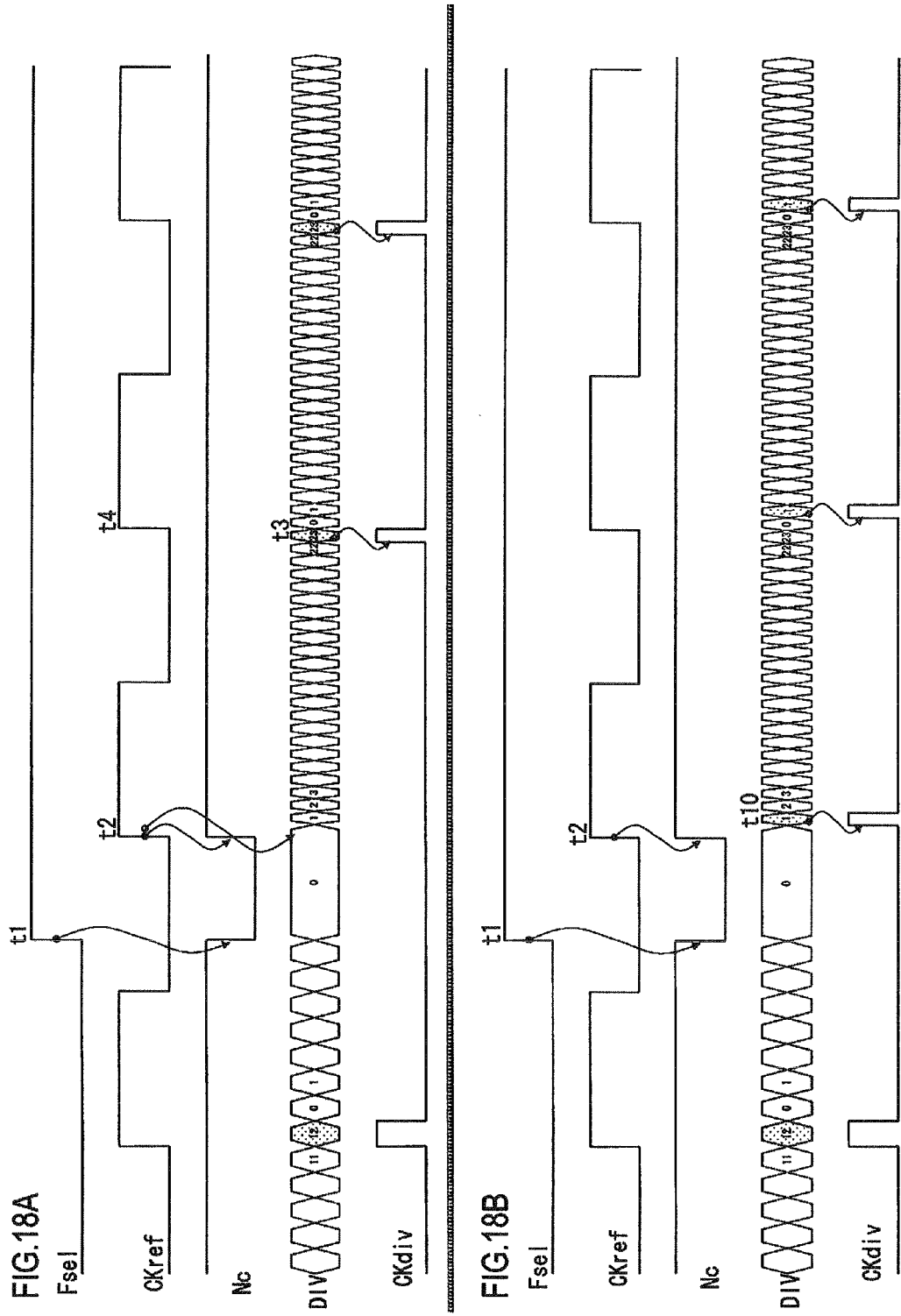

PLL FREQUENCY SYNTHESIZER

CROSS-REFERENCE TO RELATED APPLICATION

This application is a continuation of International Application No. PCT/JP2007/000244, filed on Mar. 16, 2007, now pending, herein incorporated by reference.

FIELD

The embodiments discussed herein are related to a PLL (phase-locked loop) frequency synthesizer.

BACKGROUND

Wireless technology using ultra-wide frequency bands (UWB: Ultra Wideband) uses a frequency synthesizer which may rapidly switch oscillation frequencies. For example, in multiband OFDM, which is a promising candidate as a UWB transmission method, so-called "frequency hopping" is employed in which a frequency band is divided into a plurality of bands, and the frequency band used is switched rapidly. For example, suppose that three frequency bands, with different central frequencies of for example 3432 MHz, 3960 MHz, and 4488 MHz, are utilized by switching appropriately using frequency hopping. In this case, it is preferable to switch frequency bands with high switching speed less than for example 9.5 ns.

FIG. 1 depicts frequency hopping of a frequency synthesizer. The horizontal axis indicates time, and the vertical axis is the output frequency of the frequency synthesizer. As depicted in the figure, the frequency synthesizer switch the output frequency from f2 to f1, preferably in a short time Dt (less than 9.5 ns).

On the other hand, a frequency synthesizer is realized by a PLL circuit which generates a high-speed clock phase-synchronized to a reference clock which is generated by a local oscillator or similar. That is, by switching the frequency division ratio of the frequency divider of the PLL circuit, an output clock at different frequencies may be generated.

FIG. 2 depicts the output frequency characteristic of a PLL circuit. In the case of a PLL circuit, the time Tlock until lock-in, at which the oscillation frequency is stabilized in the feedback loop, is of microsecond order, and lock-in within the short time Dt depicted in FIG. 1 is not easy.

There have been various proposals for shortening the lock-in time Tlock in a PLL circuit, as for example in Japanese Laid-open Patent Publication No. 07-288471, Japanese Laid-open Patent Publication No. 2002-57578, Japanese Laid-open Patent Publication No. 11-316618, and Japanese Laid-open Patent Publication No. 2001-339301. For example, in Japanese Laid-open Patent Publication No. 07-288471, when the PLL circuit frequency division ratio is switched, the time constant of a filter in the PLL loop is reduced and the responsiveness heightened, and the time constant is increased gradually each time undershoot or overshoot occur to reduce the responsiveness, in order to shorten the time to lock-in.

In Japanese Laid-open Patent Publication No. 2001-339301, a method is proposed in which a voltage-controlled oscillator (VCO) within the PLL circuit has a plurality of control codes to set the resonance frequency, and prior to normal operation, the optimum control code is searched for and selected from a plurality of control codes setting the resonance frequency of the VCO, the control code is set such that the VCO output frequency is within the desired frequency range, and thereafter lock-in operation is performed by the PLL loop circuit through normal operation. By this means, the effective dynamic range of the VCO may be broadened.

As a separate proposal, in order to enable frequency hopping between the above three frequency bands, three different PLL circuits each with different frequency division ratios may be provided, and output clocks, phase-synchronized with a reference clock, may be output in the respective frequency bands by the PLL circuits, with switching of the PLL circuit output clocks performed. By means of this configuration, frequency hopping in a short time is possible.

However, when employing a configuration in which a plurality of PLL circuits are provided and switching between the output clocks thereof is performed, the circuit scale is increased and power consumption also increases, so that such a solution is not practical. A method is preferable such that the output clock frequency may be rapidly switched in a single PLL circuit.

SUMMARY

According to an aspects of the invention, a frequency synthesizer includes a voltage-controlled oscillator which oscillates signals at a frequency according to a control voltage, a frequency divider which divides the frequency of an output signal of the voltage-controlled oscillator and for which a frequency division ratio is variably-set at a ratio selected from among a plurality of frequency division ratios in response to a frequency selection signal, a phase frequency detector which compares a phase of a reference input signal having a standard frequency with a phase of a frequency-divided output signal of the frequency divider and outputs a phase difference signal, a control voltage generation unit which generates the control voltage according to the phase difference signal, a frequency range tuning circuit which detects a frequency control code that sets a voltage-controlled frequency range of the voltage-controlled oscillator corresponding to the frequency division ratio which is variably-set, and a frequency control code memory which stores the frequency control code detected by the frequency range tuning circuit corresponding to the frequency division ratio.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 18 depicts a modified example of the PLL frequency synthesizer of the third embodiment.

DESCRIPTION OF EMBODIMENTS

Preferred embodiments of the present invention will be explained with reference to accompanying drawings.

Figure 1:
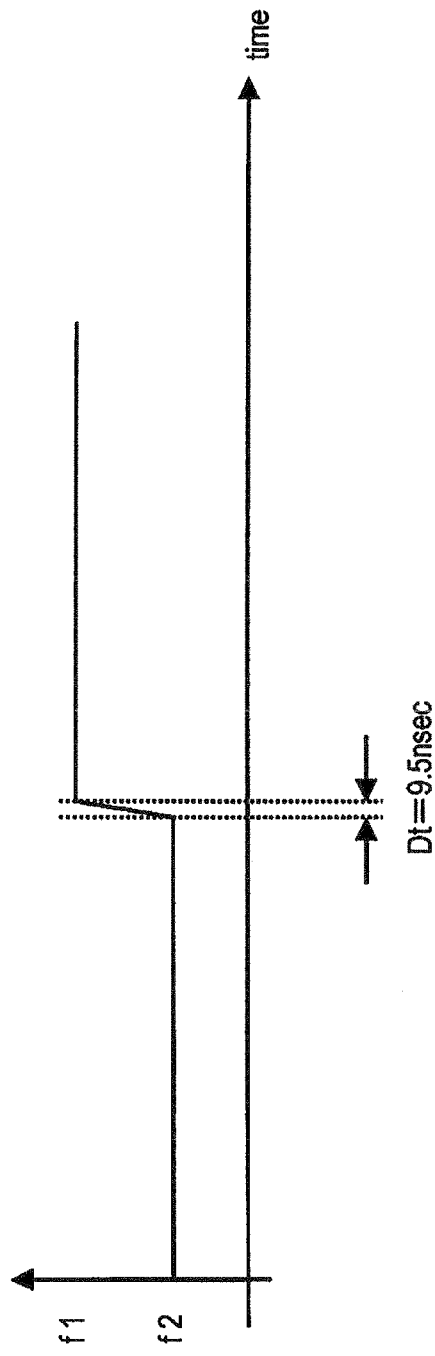
FIG. 1 depicts frequency hopping of a frequency synthesizer.
Figure 2:
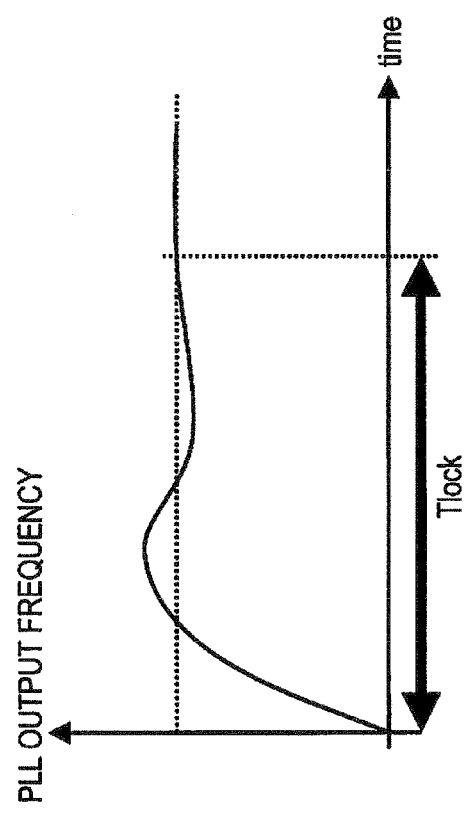
FIG. 2 depicts the output frequency characteristic of a PLL circuit.
Figure 3:
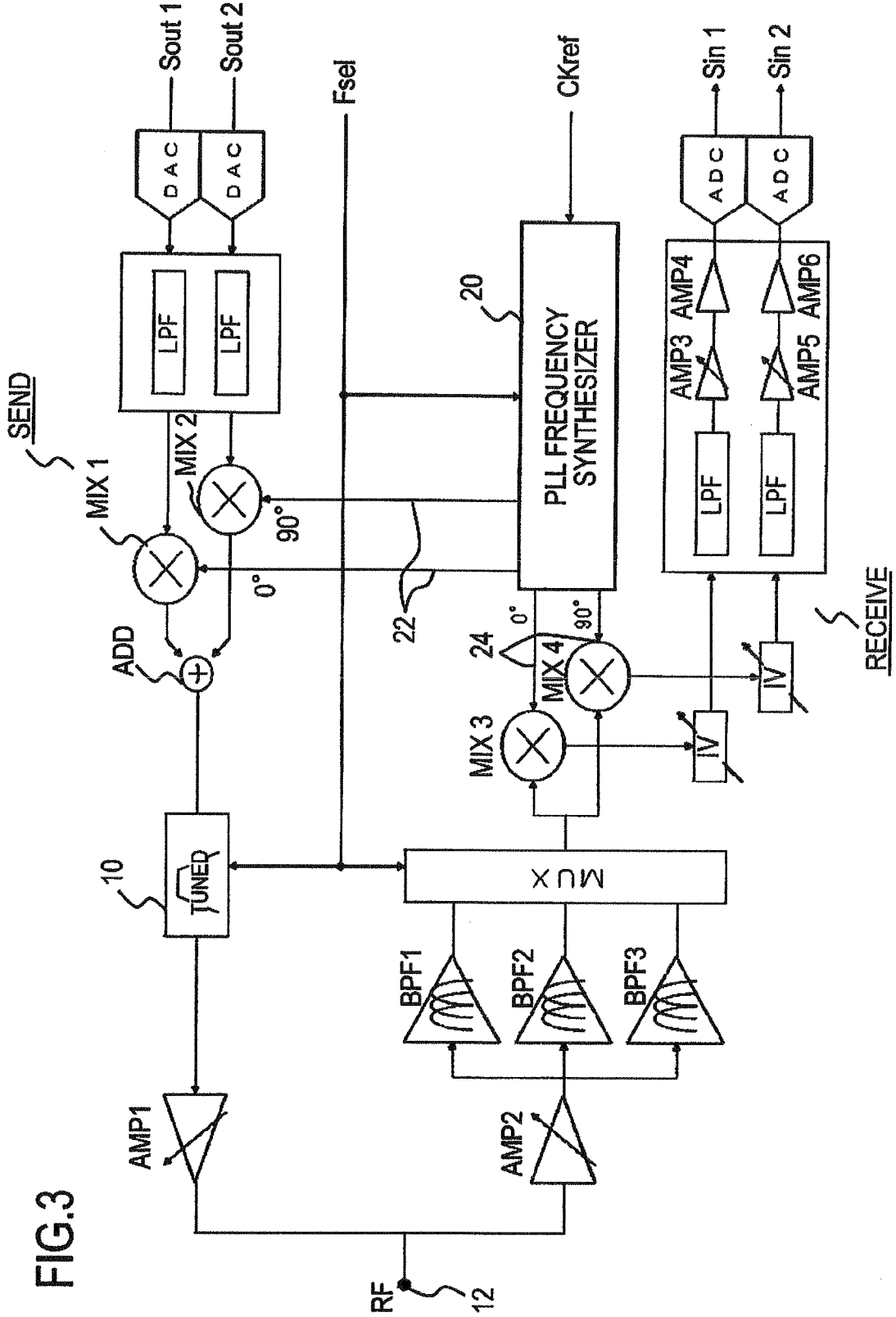
FIG. 3 depicts the configuration of a wireless communication device to which a PLL frequency synthesizer of the present embodiments is applied.

FIG. 3 depicts the configuration of a wireless communication device to which a PLL frequency synthesizer of the present embodiments is applied. In the drawing, the transmission side SEND and the reception side RECEIVE are coupled to a radio antenna 12. On the transmission side SEND, transmission signal series Sout1 and Sout2 are converted into analog signals by a digital/analog converter DAC, the analog signals pass through low-pass filters LPF, and multipliers MIX1, MIX2 then multiply the signal series by high-frequency clocks 22 with phases shifted by 90° to perform orthogonal conversion. After then passing through the adder ADD, the modulator 10 modulates the transmission signals corresponding to the selected frequency band, and the high-frequency signals pass through the amplifier AMP1 and are transmitted from the antenna 12.

On the other hand, on the reception side RECEIVE, reception signals received by the antenna 12 are amplified by the amplifier AMP2, three types of bandpass filter BPF1, 2, 3 extract the signals in the respective frequency bands, and the multiplexer MUX selects the signals of the selected frequency band. The multipliers MIX3, MIX4 then multiply the signals by high-frequency clocks 24 phase-shifted 90° to perform orthogonal demodulation. And, after passing through IVs, low-pass filters, variable amplifiers AMP3, 5, and amplifiers AMP4, 6, reception signal series Sin1, Sin2 are generated.

The PLL frequency synthesizer 20 generates the high-frequency signals 22, 24, with phase shifted by 90° as above, from the reference input signals (reference clock) CKref generated by an oscillator, not depicted. These high-frequency signals have the frequency selected by the frequency selection signal Fsel. In the above-described frequency hopping, the PLL frequency synthesizer 20 rapidly switches the frequency of the output signals 22, 24 in response to the frequency selection signal Fsel.

Figure 4:
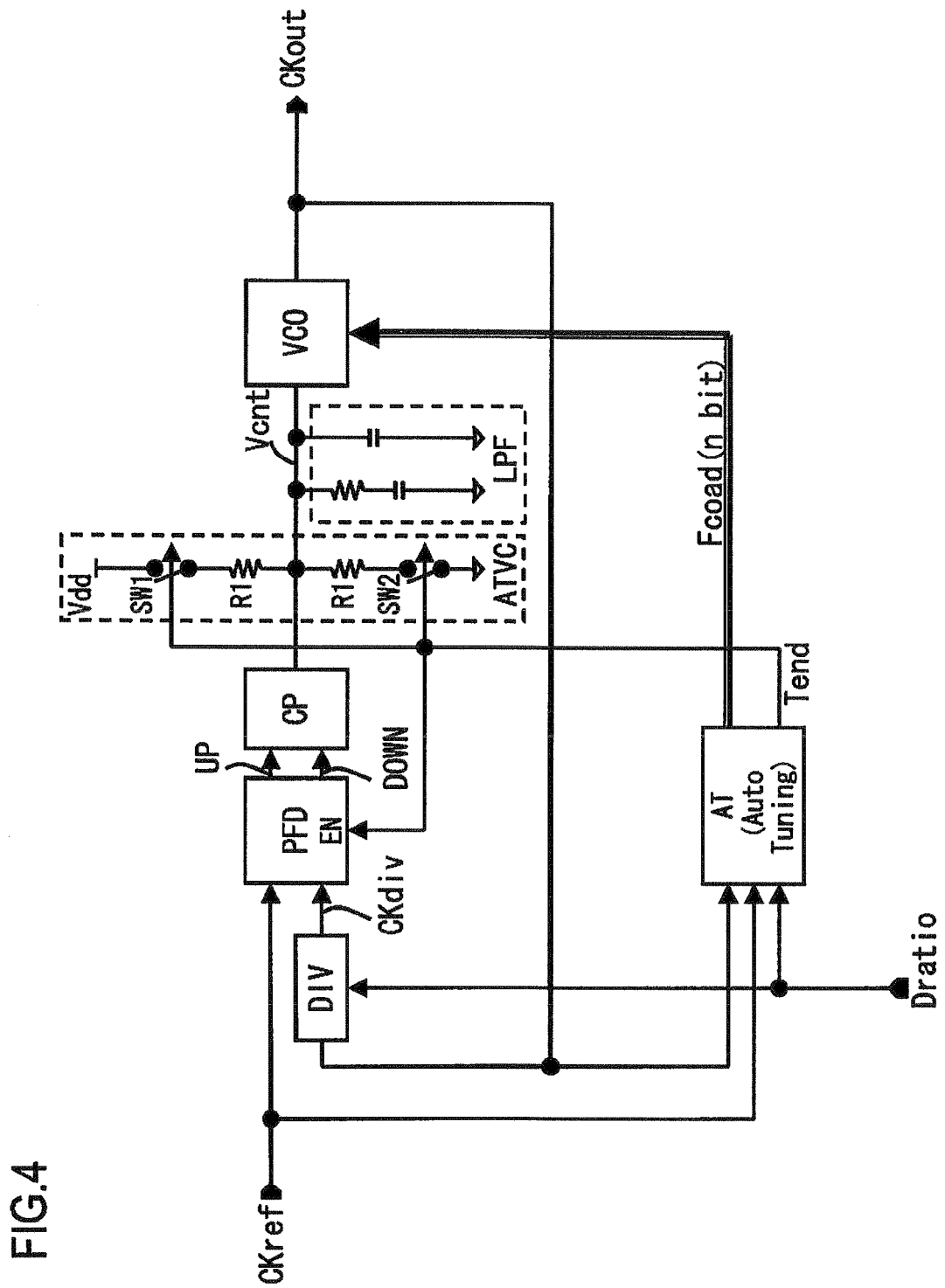
FIG. 4 depicts the basic configuration of a PLL frequency synthesizer.

FIG. 4 depicts the basic configuration of a PLL frequency synthesizer. This PLL frequency synthesizer has a voltage-controlled oscillator VCO, which generates signals at a frequency according to a control voltage Vcnt; a frequency divider DIV, which divides the frequency of the output signal CKout of the voltage-controlled oscillator VCO; a phase frequency detector PFD, which compares the phases of a reference input signal (reference clock) CKref having a standard frequency with a frequency-divided output signal (frequency-divided clock) CKdiv of the frequency divider, and outputs phase difference signals "UP" and "DOWN"; a control voltage generator unit CP, which generates a control voltage Vcnt according to the phase difference signals UP and DOWN; and an LPF.

The phase frequency detector PFD outputs an up signal UP to raise the frequency of the output signal CKout if the phase of the frequency-divided output signal CKdiv lags the reference input signal CKref, and outputs a down signal DOWN to lower the frequency if the phase leads the reference signal CKref. The control voltage generation unit includes a charge pump circuit CP, which expels charge in response to an up signal UP and draws charge in response to a down signal DOWN, and a low-pass filter LPF having a CR circuit which is charged and discharges with the charge. Through the expelling and drawing of charge by the charge pump circuit CP, the control voltage Vcnt is raised or lowered. And, the voltage-controlled oscillator VCO generates an output signal CKout with high frequency when the control voltage Vcnt is high, and an output signal CKout with low frequency when the control voltage Vcnt is low. The low-pass filter LPF produces the desired characteristic for the response characteristic of the control voltage Vcnt, which changes corresponding to the phase difference; if the response characteristic is too sensitive, frequency undershooting and overshooting are repeated and a long time is required until lock-in, whereas if the response characteristic is too slow, a long time until lock-in is similarly required.

A frequency division ratio is set variably for the frequency divider DIV at a ratio which is selected from among a plurality of frequency division ratios in response to a frequency selection signal Fsel. That is, the frequency selection signal Fsel may select two frequencies if there is one bit, and may select $2^n$ frequencies if there are n bits. And, when the frequency division ratio of the frequency divider DIV is set according to the frequency selection signal Fsel, the frequency of the output signal CKout is controlled at the desired frequency.

This frequency divider circuit DIV is a counter which counts the output signals CKout. For example, when the frequency divider circuit counter is set to generate a frequency-divided output signal CKdiv at every N counts, for a frequency fout of the output signal CKout, the frequency of the frequency-divided output signal CKdiv is fout/N. And, when the VCO outputs a frequency signal fout=M×fref which is M times the frequency fref of reference input signal CKref, the frequency of the frequency-divided output signal CKdiv is M×fref/N. This frequency-divided output signal is controlled so as to be phase-synchronized with the reference input signal CKref. Hence by modifying the frequency division ratio N, the frequency fout of the output signal CKout of the VCO may be modified.

Figure 5:
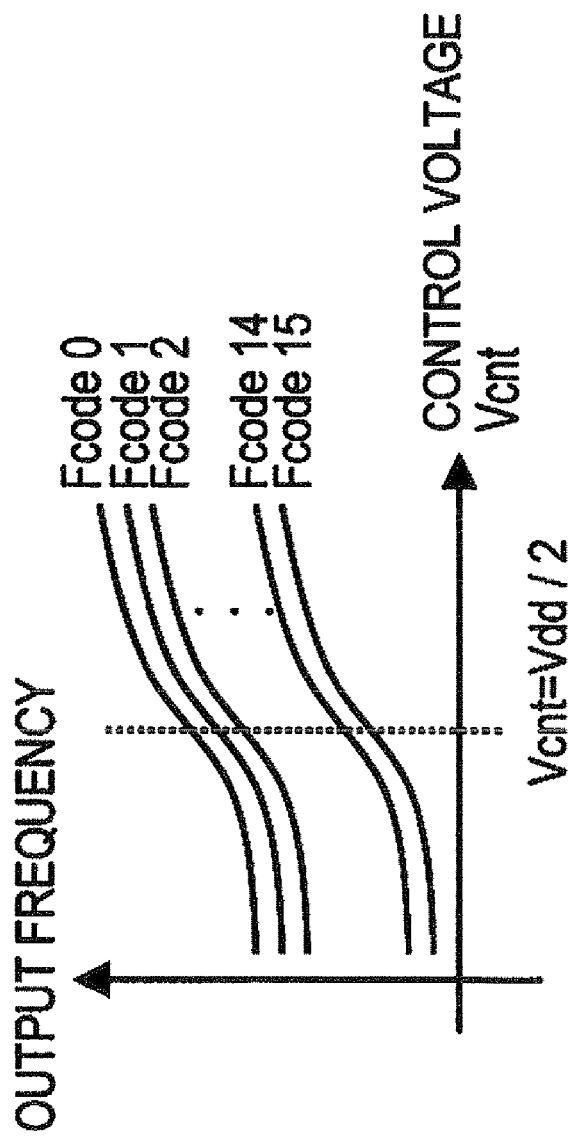
FIG. 5 depicts the relation between the control voltage Vcnt and the output frequency for the voltage-controlled oscillator VCO.

FIG. 5 depicts the relation between the control voltage Vcnt and the output frequency of the voltage-controlled oscillator VCO. The voltage-controlled oscillator VCO controls the oscillation frequency according to the control voltage Vcnt. However, there are fixed limits to the controllable frequency range of the voltage-controlled oscillator VCO corresponding to the dynamic range of the VCO. Hence the voltage-controlled oscillator VCO is configured to be able to change controllable frequency range according to a plurality of frequency control codes Fcode 0 to 15. For example, in the above-described Japanese Laid-open Patent Publication No.

2001-339301, the VCO is configured such that the resonance frequency of the oscillator is different depending on the frequency control code. By employing such a configuration, voltage control of frequencies over a broader frequency band is possible, even when there are limits to the dynamic range. The control voltage Vcnt of the voltage-controlled oscillator VCO has a voltage value between ground and the power supply voltage Vdd. For this reason, the VCO is designed such that when the control voltage Vcnt is Vdd/2, the oscillation frequency corresponds to the central frequency of the frequency range controllable by voltage.

Figure 6:
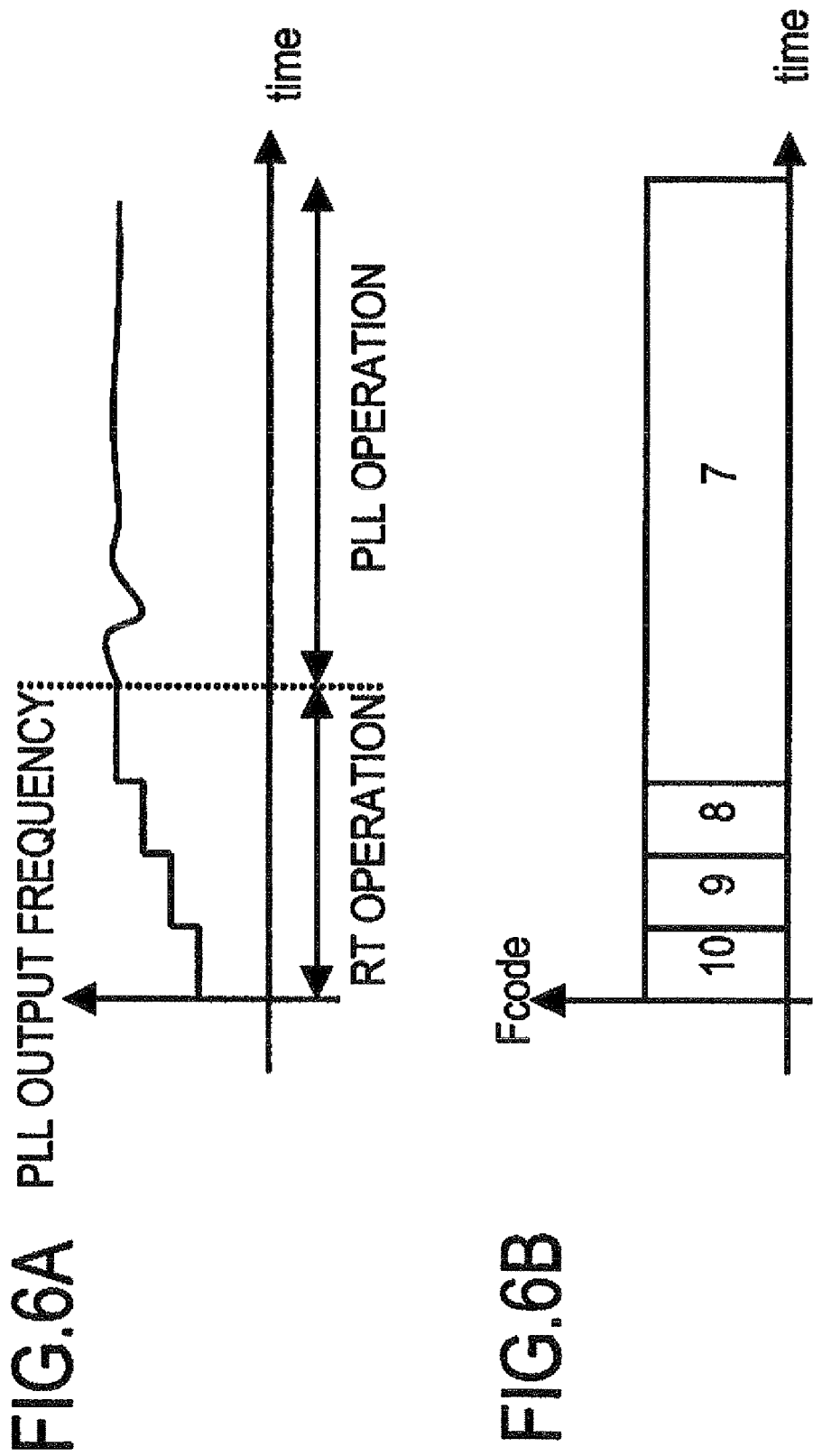
FIG. 6 depicts the operation during frequency-switching of the PLL frequency synthesizer of FIG. 4.

FIG. 6 depicts the operation during frequency-switching of the PLL frequency synthesizer of FIG. 4. As explained above, frequency switching is performed by changing the frequency division ratio Dratio of the frequency divider DIV. In response to changing this frequency division ratio Dratio, the automatic tuning circuit AT changes a tuning end signal Tend to L level, puts the phase frequency detector PFD into the disabled state, and halts phase comparison. In response to Tend=L, the switches SW1 and SW2 of the automatic tuning control voltage generation circuit ATVc enter the conducting state, and the control voltage Vcnt becomes the central voltage Vdd/2. That is, the control voltage Vcnt of the voltage-controlled oscillator VCO becomes a voltage value corresponding to the central frequency of the controllable frequency range. In this state, rough tuning operation is performed.

In rough tuning operation ("RT operation" in the figure), the automatic tuning circuit AT sequentially changes the frequency control code Fcode from a prescribed code, while monitoring the frequency of the output signal CKout of the VCO, and checks whether this roughly coincides with the switched frequency band. Specifically, the automatic tuning circuit AT counts the number of pulses of the output signal CKout within the interval of one period of the reference input signal CKref, and checks whether the count value is near the desired count value.

In the example of FIG. 6, the frequency control code Fcode is switched to 10, 9, 8, 7 with the passage of time, and the frequency of the output signal CKout gradually rises correspondingly. And, the frequency of the output signal CKout roughly coincides with the switched frequency when Fcode is 7 (Fcode=7), so that the automatic tuning circuit AT changes the tuning end signal Tend, which indicates the end of rough tuning, to H level.

In response to this, the switches SW1 and SW2 enter the nonconducting state, and the phase frequency detector PFD enters the enabled state. As a result, the PLL circuit starts PLL operation. In PLL operation, the charge pump circuit CP and the low-pass filter LPF control the control voltage Vcnt according to the phase difference signals UP and DOWN of the phase frequency detector, and the VCO generates output signals CKout in the frequency range of the frequency control code Fcode=7, with a frequency to effect phase synchronization with the reference input signal CKref.

The rough tuning and PLL operation of the above FIG. 6 are performed each time the frequency is switched. Hence at the time of frequency switching, the PLL takes a long time to enter the lock-in state. Under such circumstances, rapid frequency hopping which may be used in UWB may not be realized.

Figure 7:
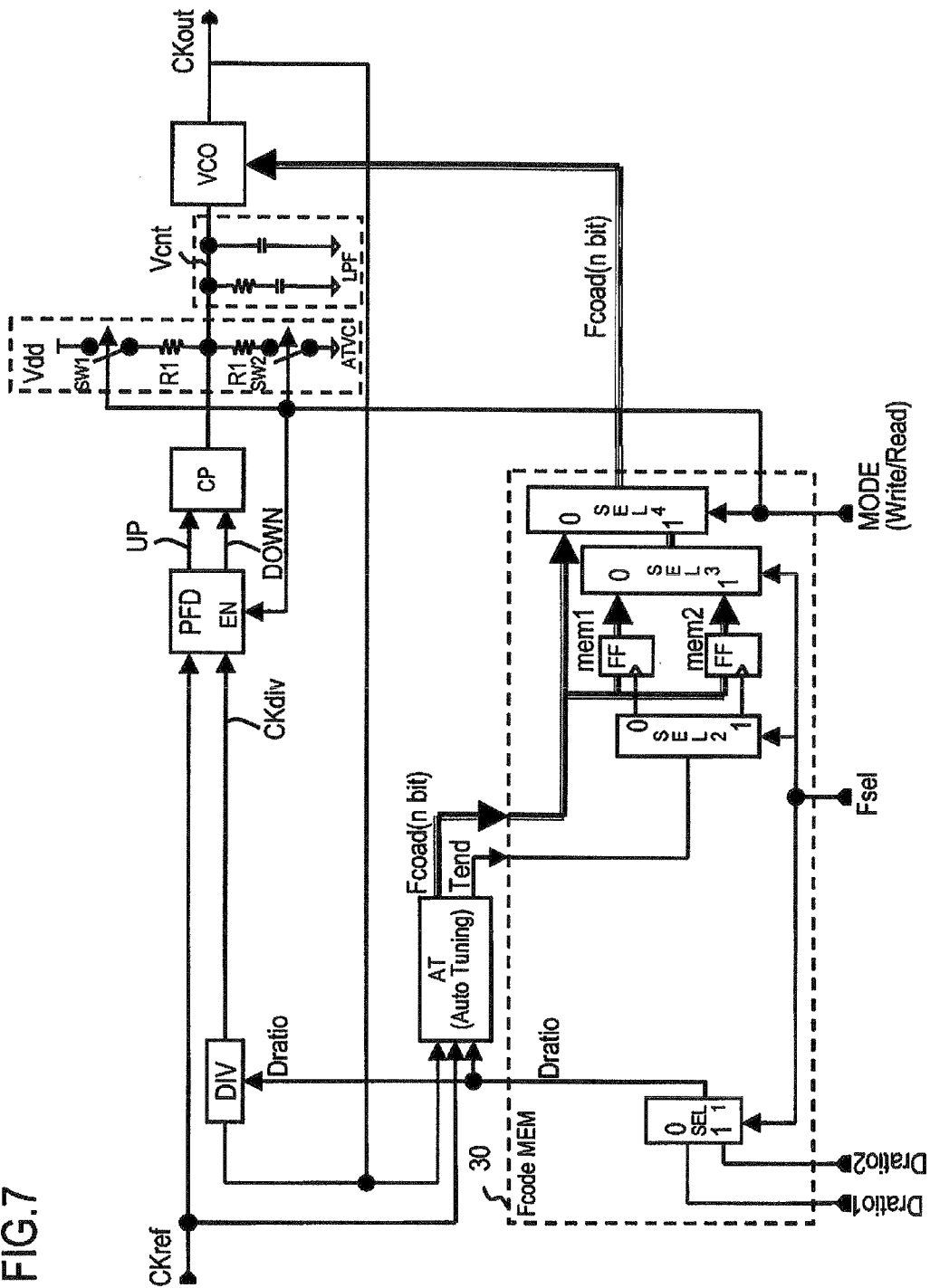
FIG. 7 depicts the configuration of the PLL frequency synthesizer of a first embodiment.

FIG. 7 depicts the configuration of the PLL frequency synthesizer of a first embodiment. In addition to the configuration of FIG. 4, this PLL frequency synthesizer has frequency control code memory 30, which stores each of the frequency control codes corresponding to a plurality of frequency division ratios which may be selected at the time of power supply input or at other times in initial operation. The frequency control code memory 30 has memory units mem1, 2 which store frequency control codes Fcode detected by the automatic tuning circuit AT through rough tuning. The memory units mem1, 2 each include n flip-flops FFs corresponding to the number of bits n of the frequency control codes. In the example of FIG. 7, two frequency division ratios Dratio1, 2 may be set in the frequency divider DIV. That is, each time the frequency selection signal Fsel is switched to H or to L, the frequency division ratios Dratio1, 2 are set in the frequency divider DIV in alternation, and the VCO generates an output signal CKout at the frequency corresponding to the frequency division ratio.

Figure 8:
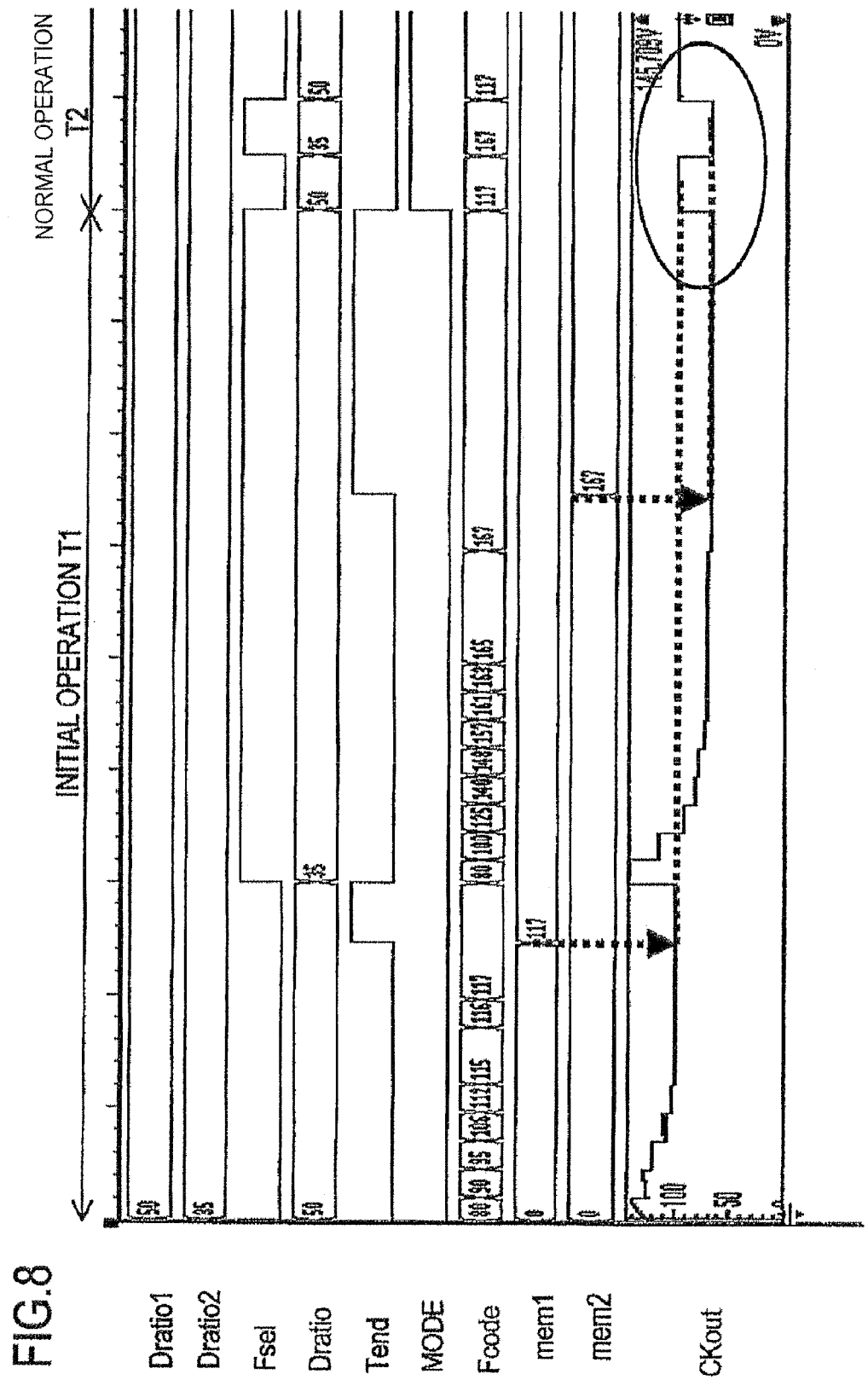
FIG. 8 is a waveform diagram depicting the operation of the PLL frequency synthesizer of FIG. 7.

FIG. 8 is a waveform diagram depicting the operation of the PLL frequency synthesizer of FIG. 7. Operation of the PLL frequency synthesizer of FIG. 7 is explained referring to this figure. At the time of power supply input, at system reset and at other times, the PLL frequency synthesizer performs initial operation. In the initial operation interval T1, the mode signal MODE is changed to L level, the frequency control code memory 30 is changed to write mode, and the selector SEL4 outputs the frequency control codes Fcode of the automatic tuning circuit AT (a frequency range tuning circuit) to the VCO. By changing the mode signal MODE to L, the automatic tuning control voltage generation circuit ATVc changes the control voltage Vcnt to Vdd/2, and the phase frequency detector PFD enters the disabled state. In the initial operation interval T1, the automatic tuning circuit AT sequentially detects the optimum frequency control codes Fcode corresponding to the plurality of frequency division ratios Dratio1, 2, and the frequency control code memory 30 stores the detected frequency control codes Fcode in memory units mem1, 2.

First, when the frequency selection signal Fsel is changed to L level, the frequency division ratio Dratio1=50 is selected by the selector SEL1. In response to this selection, the automatic tuning circuit AT sequentially switches the frequency control code Fcode to 80, 90, 95, 106, 112, 115, 116, 117, while monitoring the frequency of the respective VCO output signals CKout, and when the frequency roughly coincides with the frequency corresponding to the frequency division ratio Dratio1=50, the tuning end signal Tend is switched to H level. In response to this tuning end signal Tend=H, the memory unit mem1 stores the frequency control code Fcode=117. Next, the frequency selection signal Fsel is switched to H level, and the frequency division ratio Dratio2=35 is selected by the selector SEL1. In response to this selection, the automatic tuning circuit AT sequentially switches the frequency control code Fcode to 80, 100, 125, 140, 148, 157, 161, 163, 165, 167, while monitoring the frequency of the VCO output signals CKout, and when the frequency coincides with the frequency band corresponding to the frequency division ratio Dratio1=35, the tuning end signal Tend is switched to H level. In response to this tuning end signal Tend=H, the memory unit mem2 stores the frequency control code Fcode=167.

When the initial operation interval T1 ends, the mode signal MODE is switched to H level, and the PLL frequency synthesizer transitions to the normal operation interval T2. In the normal operation interval T2, rough tuning is not performed each time the frequency is switched, and the frequency control code memory 30 outputs the frequency codes stored in memory units mem1, 2 to the VCO. That is, the frequency control code memory 30 enters readout mode in response to a mode signal MODE=H, and the selector SEL4 selects memory units mem1, 2. And, in response to a mode signal MODE=H, the phase frequency detector PFD enters the enabled state and the automatic tuning control voltage generation circuit ATVc enters the disabled state.

When the frequency selection signal Fsel=L, the selector SEL3 selects the frequency control code of memory unit mem1, and outputs via the selector SEL4 the frequency control code Fcode=117 stored in memory unit mem1. And, the selector SEL1 selects the frequency division ratio Dratio1=50 and sets this in the frequency divider DIV. By this means, during the normal operation interval T2 the PLL frequency synthesizer supplies the frequency control code Fcode=117 corresponding to the frequency division ratio Dratio1=50 to the VCO without performing rough tuning, so that immediate transitioning to the PLL operation depicted in FIG. 6A is possible.

Similarly, when the frequency selection signal Fsel=H, the selector SEL3 selects the frequency control code of memory unit mem2, and outputs via the selector SEL4 the frequency control code Fcode=167 stored in memory unit mem2. In this case also, PLL operation starts immediately without performing rough tuning. Hence the time for frequency switching may be shortened.

Figure 9:
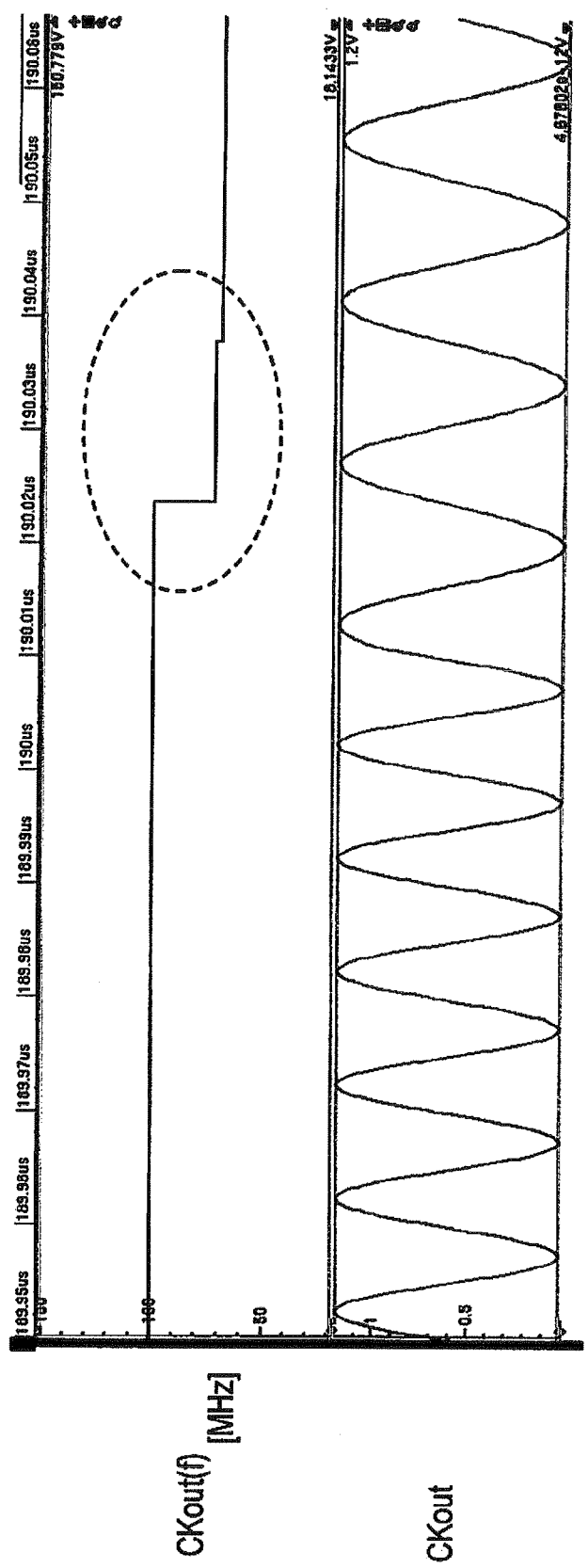
FIG. 9 depicts frequency switching of the output signal CKout indicated by the ellipse in FIG. 8.

FIG. 9 depicts frequency switching of the output signal CKout indicated by the ellipse in FIG. 8. The changes in the frequency f of the output signal CKout, and the actual output signal waveform, are depicted with time on the horizontal axis. When the frequency selection signal Fsel switches from L to H, the frequency division ratio switches from Dratio1=50 to Dratio2=35, and the frequency of the output signal CKout decreases. At this time, PLL operation begins immediately without performing rough tuning, so that the transition time until the frequency of the output signal CKout reaches the stable lock-in state is short.

Figure 10:
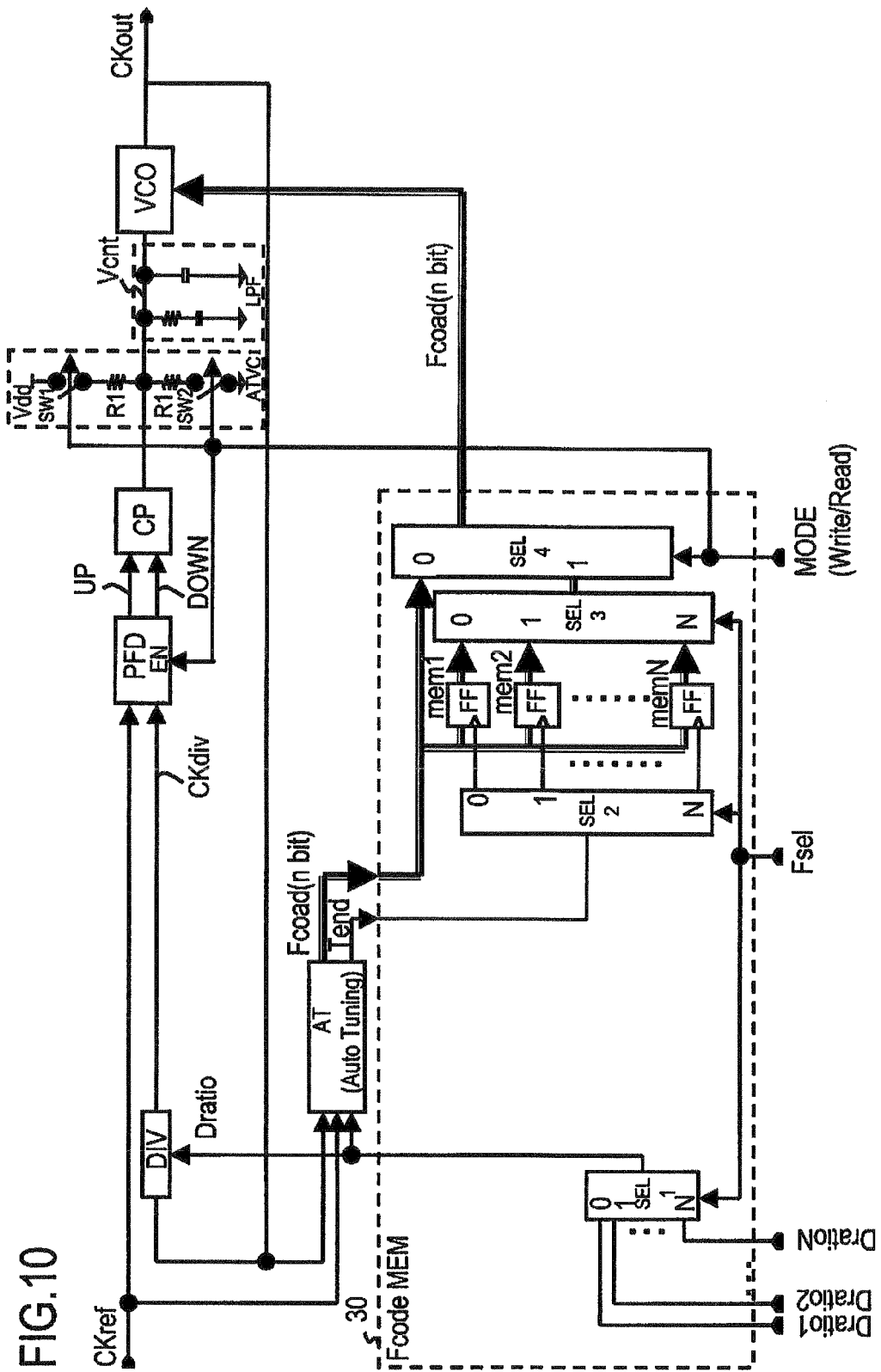
FIG. 10 depicts a modified example of the PLL frequency synthesizer of the first embodiment.

FIG. 10 depicts a modified example of the PLL frequency synthesizer of the first embodiment. This modified example is a PLL frequency synthesizer for which N (N>2) frequency division ratios Dratio1 to N may be set. Consequently, the frequency selection signal Fsel includes a plurality of bits, and the selectors SEL1, SEL2, SEL3 of the frequency control code memory 30 select one from among N inputs or outputs according to the frequency selection signal Fsel. The frequency control code memory 30 has N memory units mem 1 to N. Otherwise the configuration is the same as in FIG. 7.

In initial operation, the PLL frequency synthesizer of FIG. 10 detects frequency control codes Fcode respectively corresponding to N frequency division ratios, and stores these in memory units mem 1 to N within the frequency control code memory 30. And, in normal operation, each time the frequency selection signal Fsel switches, the frequency control code Fcode corresponding to the selected frequency division ratio is read from memory 30 and set in the VCO without performing rough tuning.

Figure 11:
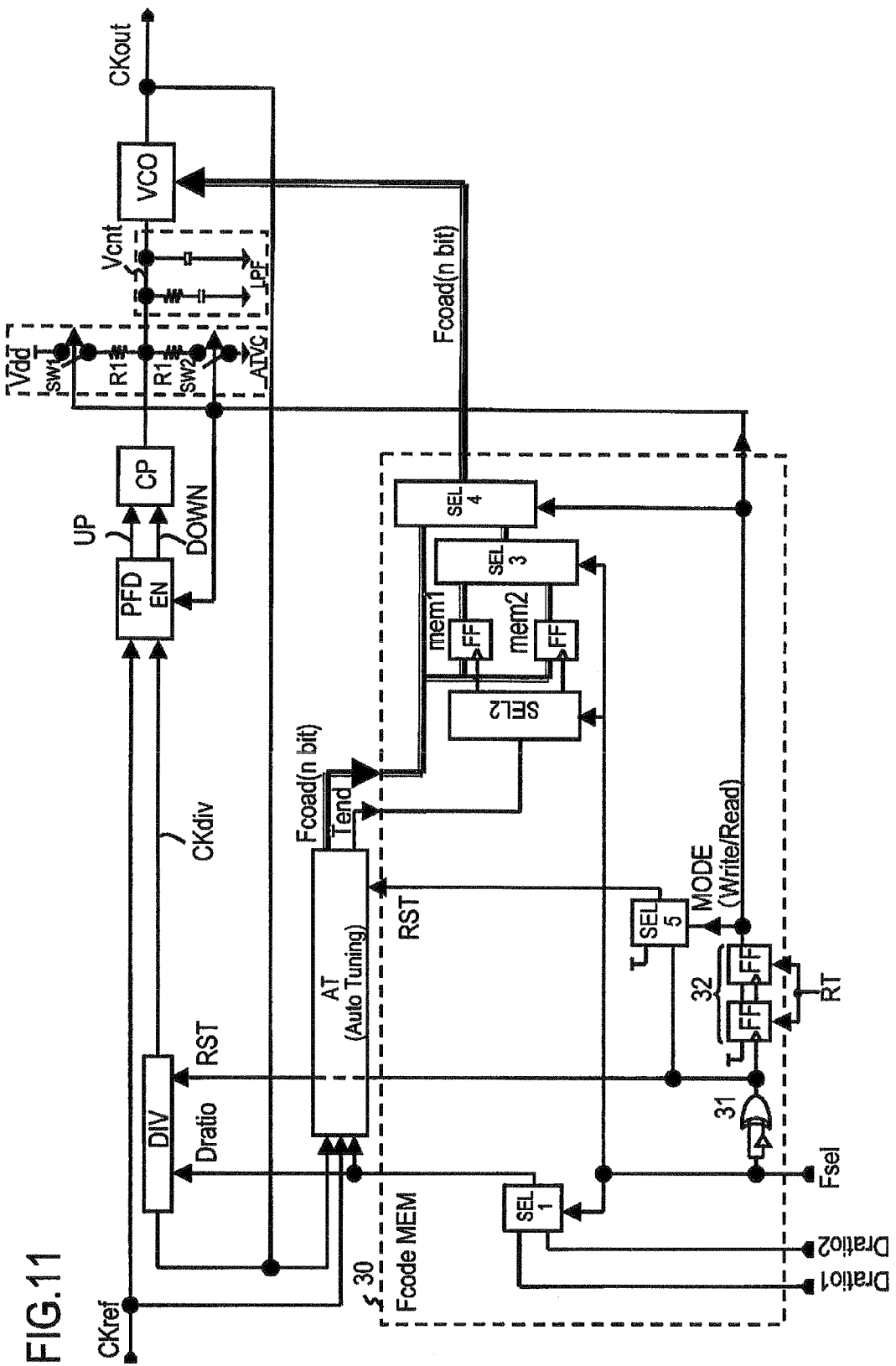
FIG. 11 depicts another modified example of the PLL frequency synthesizer of the first embodiment.

FIG. 11 depicts another modified example of the PLL frequency synthesizer of the first embodiment. In this modified example, to the frequency synthesizer of FIG. 7 have been added a one-shot pulse generation circuit 31 which automatically generates a mode signal MODE from the frequency selection signal Fsel, an initial operation counting circuit 32, and a selector SEL5. A circuit which generates mode signals MODE is formed by the one-shot pulse generation circuit 31 and the initial operation counting circuit 32. That is, when in the initial operation interval the automatic tuning circuit AT detects frequency control codes corresponding to all selectable frequency division ratios, this mode signal generation circuit generates a mode signal MODE=H to switch the frequency control code memory 30 from write mode to read mode.

In this modified example, two frequency division ratios Dratio1, 2 may be set in the frequency divider DIV. The one-shot pulse generation circuit 31 includes a delay gate and an EOR gate; each time the frequency selection signal Fsel switches from L to H level or from H to L level, a one-shot pulse is output. The initial operation counting circuit 32 includes two flip-flop serially connected, and is reset in response to a reset signal RT when the power supply is input or at another time at the start of initial operation, and changes the mode signal MODE to L level. The initial operation counting circuit 32 changes the mode signal MODE to L level (write mode) in initial operation, and thereafter, after the frequency selection signal Fsel has changed twice and a one-shot pulse has been generated twice, changes the mode signal MODE to H level. That is, the automatic tuning circuit AT detects the frequency control code corresponding to the first frequency division ratio Dratio1 when the frequency selection signal Fsel is L (Fsel=L) at the start of initial operation. Next, when the frequency selection signal Fsel is H (Fsel=H; first one-shot pulse generation), the frequency control code corresponding to the second frequency division ratio Dratio2 is detected. When this detection is completed, as depicted in FIG. 8, the frequency selection signal Fsel switches (second one-shot pulse generation), and in response, the mode signal MODE switches to H level.

During the initial operation interval, that is, while the mode signal MODE is at L level (write mode), the selector SEL5 selects the output of the one-shot pulse generation circuit 31, and each time the frequency selection signal Fsel switches, a one-shot pulse is supplied to the automatic tuning circuit AT, and the circuit AT is reset. And, during the normal operation interval, that is, when the mode signal MODE goes to H level (read mode), the selector SEL5 selects and outputs the H level, and the automatic tuning circuit AT is reset and continues. Also, the one-shot pulse causes the setting of the frequency division ratio Dratio of the frequency divider DIV to be changed. Operations other than the above are the same as in FIG. 7.

Figure 12:
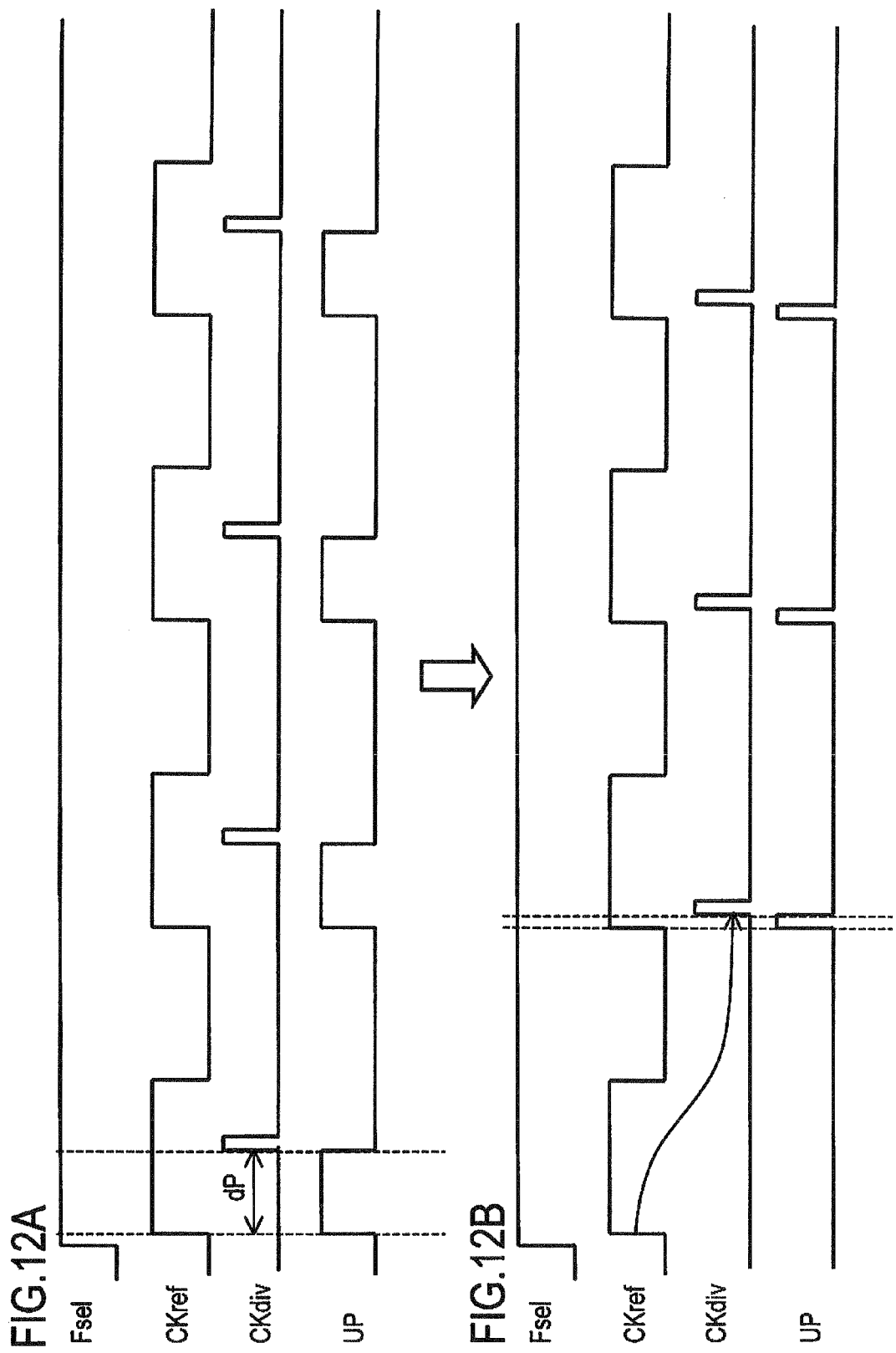
FIG. 12 explains the start of normal operation of the PLL frequency synthesizer of this embodiment.

FIG. 12 explains the start of normal operation of the PLL frequency synthesizer of this embodiment. As explained above, in initial operation the PLL frequency synthesizer stores frequency control codes corresponding to frequency division ratios, and when the frequency is switched in normal operation the frequency control code which had been stored is immediately set in the VCO. Hence during frequency hopping, the frequency difference between the reference input signal CKref and the frequency-divided output signal CKdiv is slight.

However, as depicted in FIG. 12A, when the frequency selection signal Fsel switches (switches from L to H), if there exists a phase difference dP between the reference input signal CKref and the frequency-divided output signal CKdiv at the time of frequency switching, the phase frequency detector PFD generates a phase difference signal "UP" (or "DOWN") during an interval corresponding to the phase difference dP. When PLL operation begins from this state, first the control voltage Vcnt rises according to a phase difference signal UP, and the VCO rises the frequency of the signal output CKout. Together with this, the phase of the frequency-divided output signal CKdiv is hastened, and the phase difference dP is decreased. However, while the phase difference dP is decreased temporarily, the frequency is raised, so that in another phase comparison the phase of the frequency-divided output signal CKdiv leads, a phase difference signal DOWN is generated, the control voltage Vcnt falls, and the frequency is lowered. This operation is repeated to cause the frequency-divided output signal CKdiv to be controlled such that the phase and frequency of the frequency-divided output signal CKdiv coincide with the phase and frequency of the reference input signal CKref. Hence the time until lock-in after frequency switching during normal operation is lengthened.

Therefore, in a second embodiment, at the time of frequency switching, in response to switching of the frequency selection signal Fsel the frequency divider DIV is held in the reset state and outputting of the frequency-divided output signal CKdiv is halted, and in response to the phase-comparison subjected edge (for example, the rising edge) of the reference input signal CKref, the reset state of the frequency divider DIV is released. As a result, there is a slight phase difference between the first phase-comparison subjected edge (for example, the rising edge) of the frequency-divided output signal CKdiv of the frequency divider DIV and the phase-comparison subjected edge of the reference input signal CKref. That is, as depicted in FIG. 12B, when the frequency selection signal Fsel has switched, the frequency-divided output signal CKdiv of the frequency divider is not generated, and at the rising edge of the next reference input signal CKref the frequency divider starts operation; when after this time the counter inside the frequency divider counts over count values corresponding to the frequency division ratio, the frequency-divided output signal CKdiv is first output. This operation of the frequency divider begins in synchronization with the rising edge of the reference input signal CKref, so that the phase of the first frequency-divided output signal CKdiv is close to the phase of the reference input signal. Hence the first phase difference signal UP is shorter, and the time to lock-in is shortened.

Figure 13:
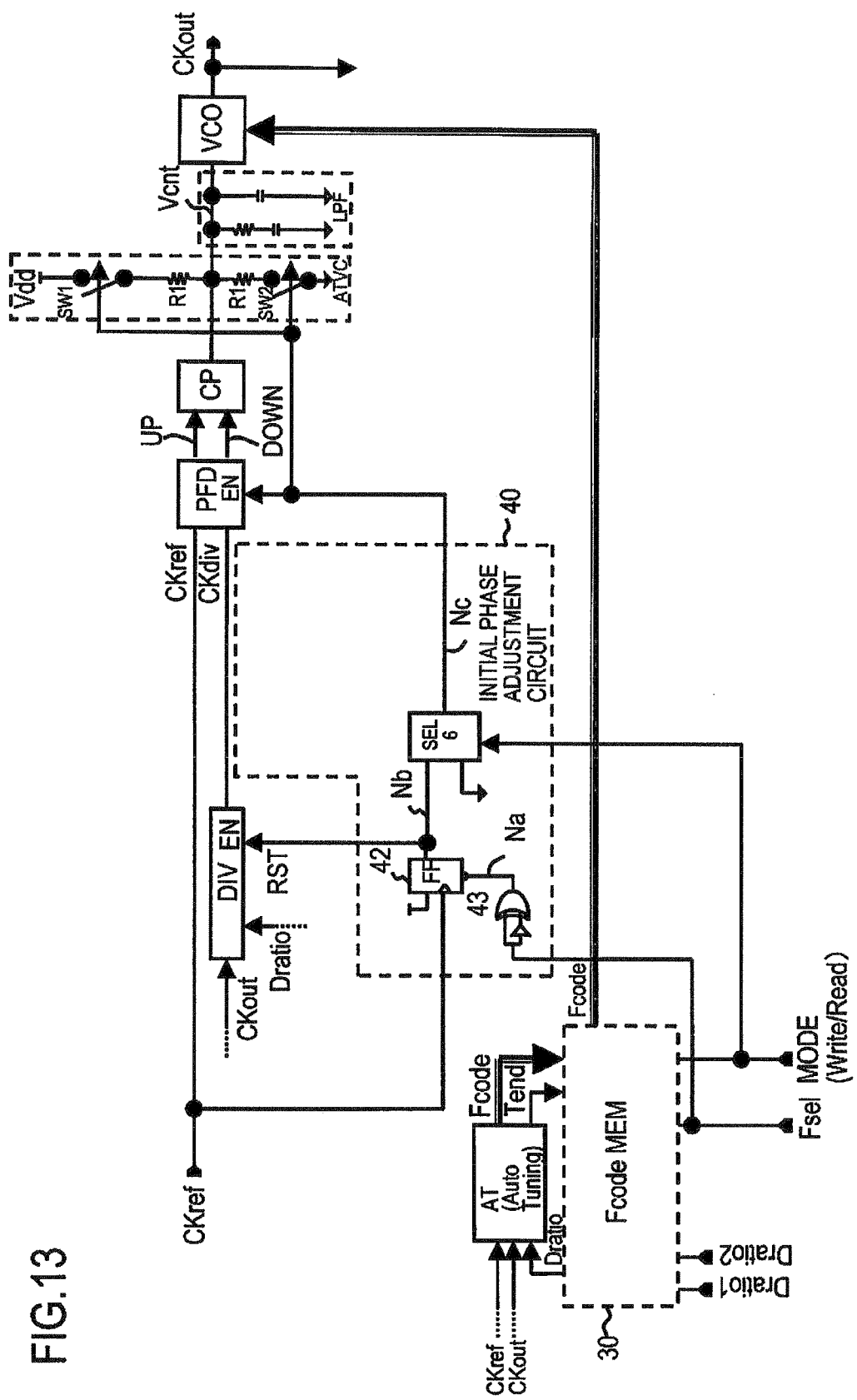
FIG. 13 depicts the configuration of a PLL frequency synthesizer in the second embodiment.

FIG. 13 depicts the configuration of a PLL frequency synthesizer in the second embodiment. This PLL frequency synthesizer has a configuration which is the configuration of the frequency synthesizer of the first embodiment in FIG. 7 or FIG. 11, but with the addition of an initial phase adjustment circuit 40, which adjusts the phase of the first frequency-divided output signal at the time of frequency switching. The initial phase adjustment circuit 40 has a one-shot pulse generation circuit 43, which generates a one-shot pulse at the time of switching of the frequency selection signal Fsel; a flip-flop 42, which is reset by a one-shot pulse, and which outputs H in response to the rising edge (phase-comparison subjected edge) of the next reference input signal CKref; and a selector SEL6, which matches the switching timing of the mode signal MODE to the reset release timing of the frequency divider DIV.

Figure 14:
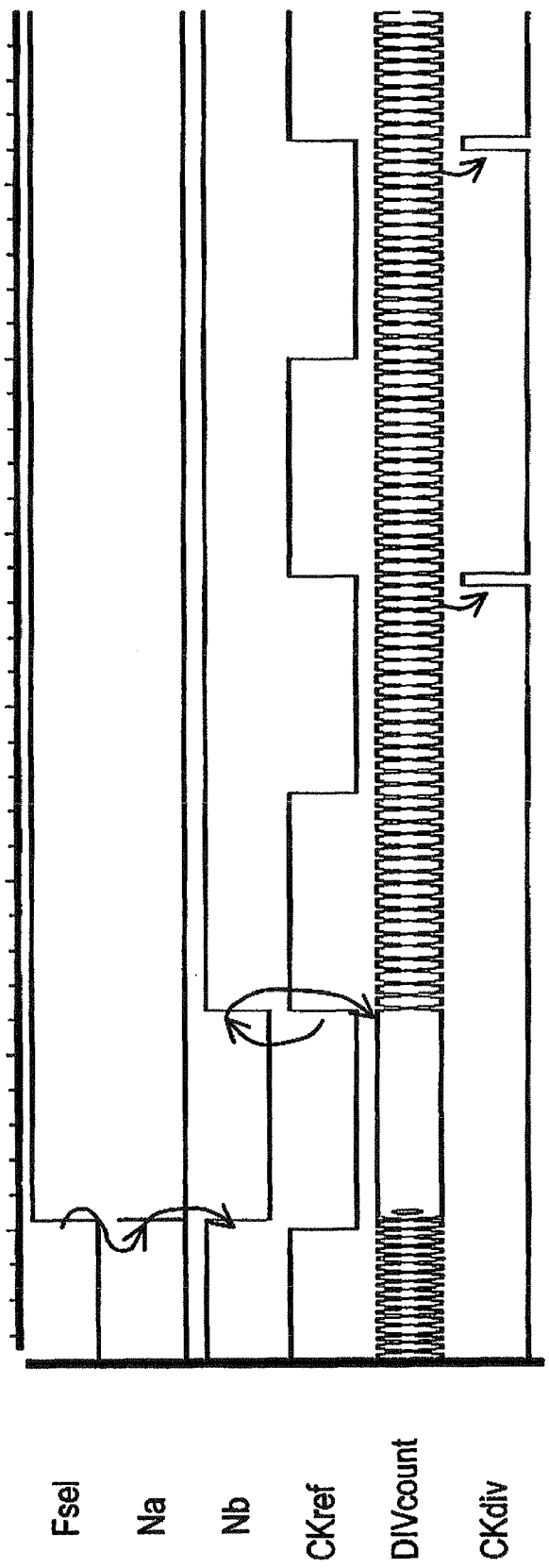
FIG. 14 is a waveform diagram depicting operation of the PLL frequency synthesizer of FIG. 13.

FIG. 14 is a waveform diagram depicting operation of the PLL frequency synthesizer of FIG. 13. Operation in FIG. 13 is explained referring to FIG. 14. First, when the frequency selection signal Fsel switches from L to H level, the one-shot pulse generation circuit 43 generates a one-shot pulse at node Na in response to the switching. By this means the flip-flop 42 is reset, node Nb goes to L level, and the frequency divider DIV enters the reset state, and the frequency-divided output CKdiv is not output. Thereafter, in response to the rising edge of the reference input signal CKref, the flip-flop 42 latches the H level input, and node Nb goes to H level. In response, the frequency divider DIV initiates frequency division operation and counting operation, and when the count value corresponding to the frequency division ratio Dratio which has been set is reached, the frequency-divided output signal CKdiv is output. Hence the phase of the first frequency-divided output signal CKdiv is extremely close to the phase of the reference input signal CKref.

When the mode signal MODE is at L level for write mode (during initial operation), the selector SEL6 selects L level to disable the phase frequency detector PFD, put the switches SW1, 2 of the automatic tuning control voltage generation circuit ATVc into the conducting state, and set the control voltage Vcnt at Vdd/2. And, when the mode signal MODE is at H level for read mode (during normal operation), the selector SEL6 selects the node Nb side, enables the phase frequency detector PFD in synchronization with the rising edge of the above-described node Nb, and puts the switches SW1, 2 of the automatic tuning control voltage generation circuit ATVc into the non-conducting state. That is, PLL operation by the phase frequency detector PFD is initiated in synchronization with the initiation of operation of the frequency divider DIV.

Figure 15:
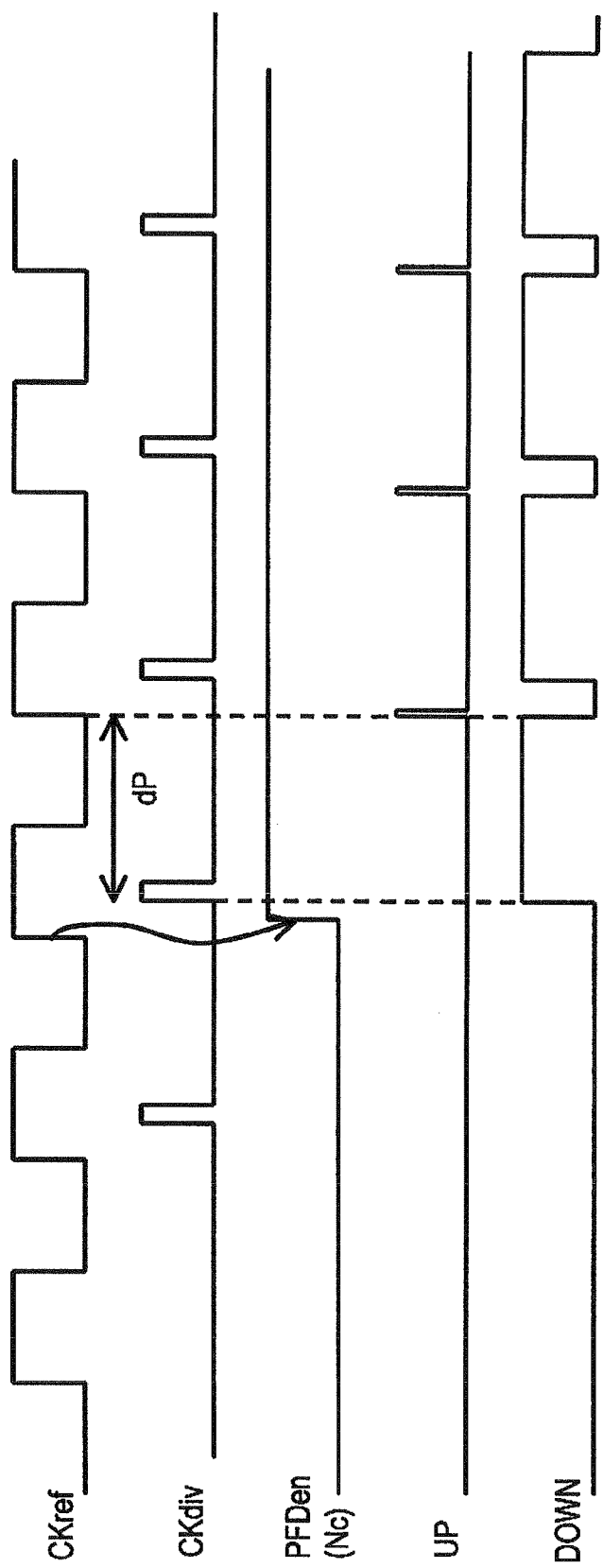
FIG. 15 illustrates the initiation of normal operation of the PLL frequency synthesizer of the second embodiment.

FIG. 15 explains the initiation of normal operation of the PLL frequency synthesizer of the second embodiment. As explained above, in the second embodiment the initiation of operation of the frequency divider DIV is synchronized with the phase-comparison subjected edge of the reference input signal CKref, so that the phase difference between the frequency-divided output signal CKdiv and the reference input signal CKref is as small as possible. However, as depicted in FIG. 15, when the enable signal PFDen at node Nc rises and operation of the phase frequency detector PFD is initiated between the phase-comparison subjected edge (rising edge) of the reference input signal CKref and the phase-comparison subjected edge (rising edge) of the frequency-divided output signal CKdiv, a large phase difference dP is detected between the interval from the phase-comparison subjected edge of the frequency-divided output signal CKdiv to the phase-comparison subjected edge of the next reference input signal CKref, and as a result the phase difference signal DOWN is output with a long pulse width. This state causes the time for lock-in to be lengthened. Hence if the phase frequency detector does not start operating during the short phase difference interval from the phase-comparison subjected edge of the reference input signal CKref to the phase-comparison subjected edge of the frequency-divided output signal CKdiv, the above-described worst state may be avoided. This is accomplished in the third embodiment.

Figure 16:
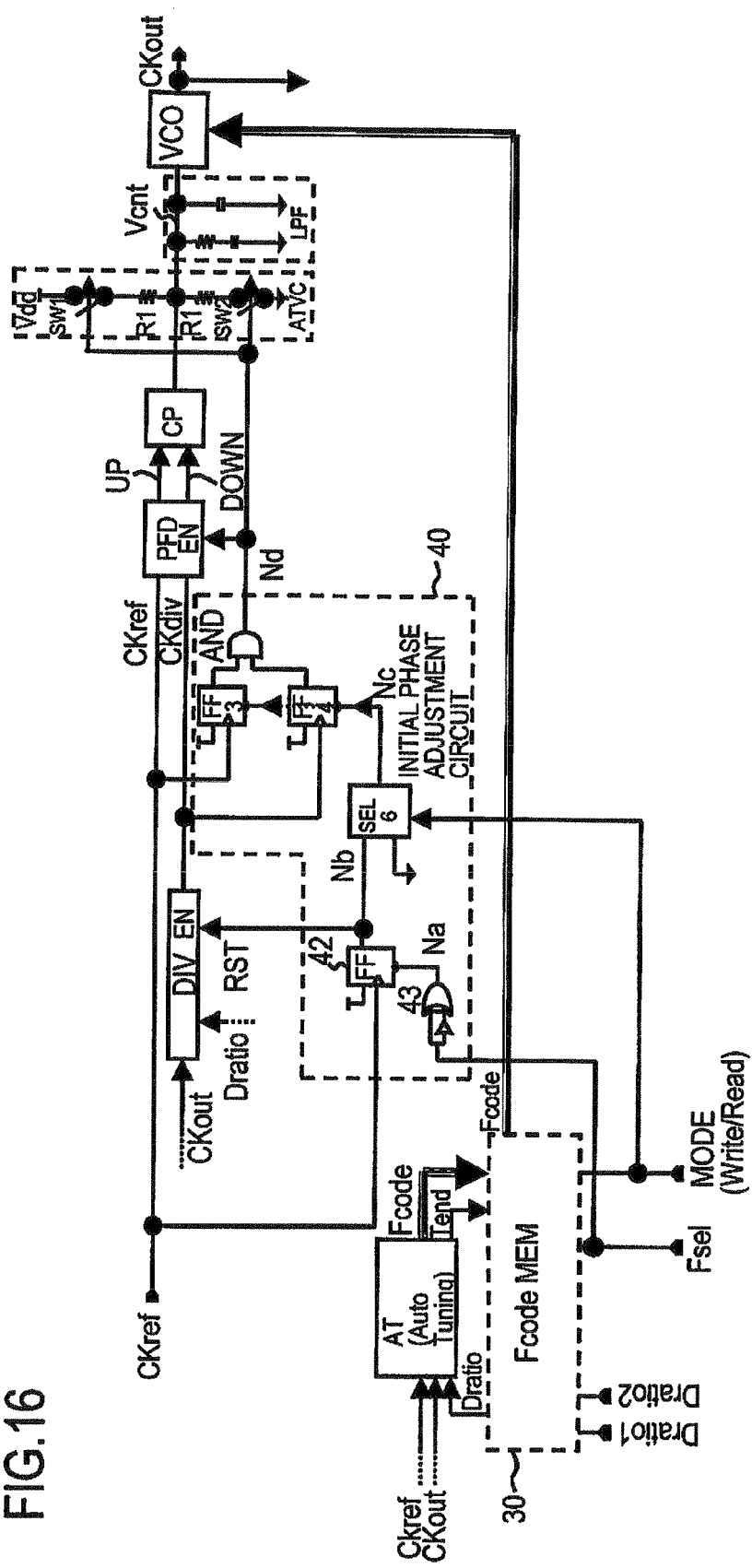
FIG. 16 depicts the configuration of the PLL frequency synthesizer of the third embodiment.

FIG. 16 depicts the configuration of the PLL frequency synthesizer of the third embodiment. This frequency synthesizer adds, to the initial phase adjustment circuit 40 of the frequency synthesizer of FIG. 13, a circuit which controls the enable timing of the phase frequency detector PFD. The circuit includes flip-flops FF3, FF4 and an AND gate AND. These flip-flops FF3, FF4 are both reset by the H level of node Nc; flip-flop FF3 latches the H level at the rising edge of the reference input signal CKref, and flip-flop FF4 latches the H level at the rising edge of the frequency-divided output signal CKdiv. The AND gate AND outputs the H level when both flip-flops FF3 and FF4 latches the H level, setting node Nd to H level, putting the phase frequency detector PFD into the enabled state, and putting the automatic tuning control voltage generation circuit ATVc into the disabled state.

Figure 17:
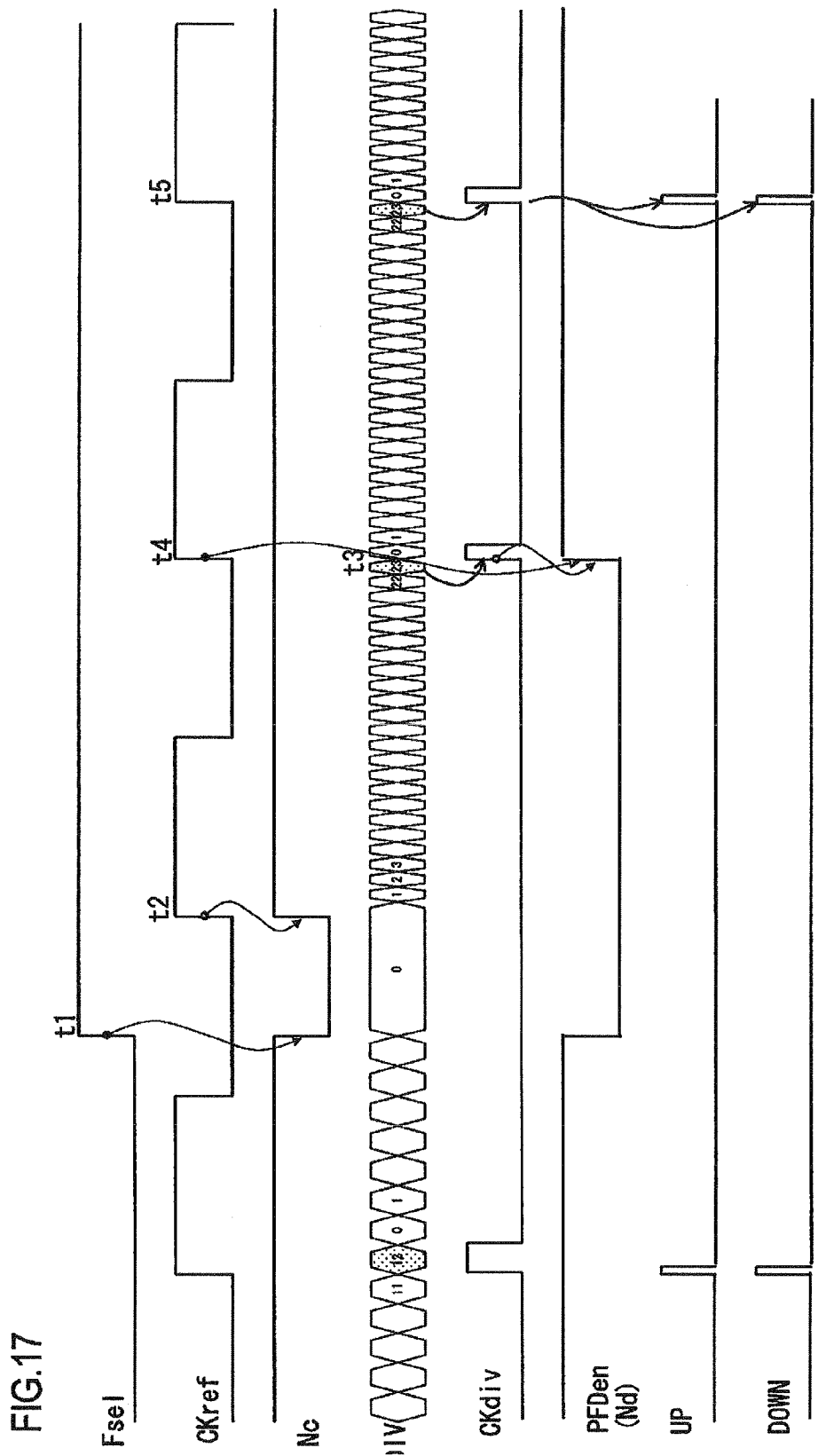
FIG. 17 is a waveform diagram depicting the operation of FIG. 16.

FIG. 17 is a waveform diagram depicting the operation of FIG. 16. Operation of the PLL frequency synthesizer of the third embodiment of FIG. 16 is explained referring to FIG. 17. In FIG. 17, during normal operation when the mode signal MODE=H, when at time t1 the frequency selection signal Fsel switches to H level, a one-shot pulse is generated at node Na and node Nb goes to L level, and node Nc also goes to L level via the selector SEL6. As a result of the L level of node Nb, the frequency divider DIV enters the disabled state. And, the frequency-divided output signal CKdiv is not supplied as a clock input to the flip-flop FF4, and node Nd, which is the output of the AND gate AND, is at L level. Hence at time t1 the phase frequency detector PFD is in the disabled state as well as the frequency divider DIV.

Next, in response to the rising edge of the reference input signal CKref at time t2, the flip-flop 42 puts the output Nb at H level, and the node Nc also goes to H level. In response, the flip-flops FF3, 4 are both reset. Because node Nb is at H, the frequency divider DIV is put into the enabled state, and the internal counter initiates counting operation. And, when at time t3 the count value of the frequency divider counter reaches "23", the frequency divider DIV outputs a frequency-divided output signal CKdiv. Further, near time t3, the reference input signal CKref rises at time t4. Hence the flip-flops FF3, 4 both output H level in response to the clock inputs, and the output Nd of the AND gate AND goes to H level, so that the phase frequency detector PFD is put into the enabled state. As a result, the phase frequency detector PFD outputs phase difference signals UP, DOWN as short pulses corresponding to the slight phase difference, and so lock-in occurs in a short time.

In this way, the phase frequency detector PFD enters the enabled state and initiates phase-comparison operation after the occurrence of the phase-comparison subjected edges (rising edges) of both the reference input signal CKref and the frequency-divided output signal CKdiv, which are close in phase. Hence at the next time t5, the phase frequency detector PFD may reliably detect the phase difference between the phase-comparison subjected edges (rising edges) of the reference input signal CKref and the frequency-divided output signal CKdiv, which are close in phase. That is, by means of the frequency control code memory 30 and the initial phase adjustment circuit 40, the frequencies of the reference input signal CKref and the frequency-divided output signal CKdiv are made close during frequency hopping, and moreover the parse difference is made slight, and this may be reliably reflected in the PLL operation, so that the time until lock-in may be shortened.

FIG. 18 depicts a modified example of the PLL frequency synthesizer of the third embodiment. FIG. 18A is equivalent to the waveform diagram of FIG. 17. That is, at time t1 the frequency selection signal Fsel switches, and at time t2 the frequency divider DIV enters the enabled state and initiates counting operation. And when at time t3 the count value reaches the frequency division setting value (Dratio) "23", a frequency-divided output pulse CKdiv is generated. Hence the phase frequency detector initiates phase-comparison operation not at time t2, but after time t3 and t4, and PLL operation begins.

On the other hand, in this modified example a frequency-divided output signal CKdiv is output when the count value of the frequency divider DIV reaches an arbitrary value close to "0", which in the figure is "1", rather than the frequency division setting "23". Operation in this case is as depicted in FIG. 18B. At time t1 the frequency selection signal Fsel switches, and at time t2 the frequency divider DIV enters the enabled state and initiates counting operation. And, when at time t10 the count value reaches "1", a frequency-divided output pulse CKdiv is generated. Hence the phase frequency detector initiates phase-comparison operation not at time t2, but at time t10, and PLL operation begins. That is, PLL operation is initiated earlier than in FIG. 18A, and the time until lock-in may be further shortened.

As explained above, upon entering the enabled state the frequency divider DIV of the modified example initiates counting of the VCO output signal CKout, repeats the counting operation until the count value "23" corresponding to the selected frequency division ratio is reached, and each time the count value of the frequency divider reaches an arbitrary count value "1" other than the counting initiation value "0" and the count value "23" corresponding to the frequency division ratio, a frequency-divided output signal CKdiv is output.

It is desirable that the reference input signal CKref, frequency-divided output signal CKdiv, and PLL output signal CKout be square-wave pulse signals. However, sinusoidal signals, such as that depicted for the output signal CKout in FIG. 9, are acceptable if the slew rate is high (the rising edge and falling edge are steep).

Further, the edge used for phase comparison of the reference input signal CKref and the frequency-divided output signal CKdiv by the phase frequency detector may be the rising edge or the falling edge.

A PLL frequency synthesizer of this invention may perform frequency switching rapidly. Hence utilization as a clock generation circuit in next-generation UWB systems is anticipated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

What is claimed is:

1. A frequency synthesizer comprising:
a voltage-controlled oscillator which oscillates signals at a frequency according to a control voltage;
a frequency divider which divides the frequency of an output signal of the voltage-controlled oscillator and for which a frequency division ratio is variably-set at a ratio selected from among a plurality of frequency division ratios in response to a frequency selection signal;
a phase frequency detector which compares a phase of a reference input signal having a standard frequency with a phase of a frequency-divided output signal of the frequency divider and outputs a phase difference signal;
a control voltage generation unit which generates the control voltage according to the phase difference signal;
a frequency range tuning circuit which detects a frequency control code that sets a voltage-controlled frequency range of the voltage-controlled oscillator corresponding to the frequency division ratio which is variably-set; and
a frequency control code memory which stores the frequency control code detected by the frequency range tuning circuit corresponding to the frequency division ratio; wherein
in an initialization interval, the frequency range tuning circuit detects a plurality of frequency control codes which corresponds to the plurality of frequency division ratios respectively, and the frequency control code memory stores the plurality of frequency control codes which are detected, and
in a normal operation interval, following the initialization interval, one of the plurality of frequency control codes which are detected in the initialization interval is output to the voltage-controlled oscillator selectively in response to the frequency selection signal.

2. The frequency synthesizer according to claim 1, wherein the number of the plurality of frequency control codes exceeds 2.

3. The frequency synthesizer according to claim 1, wherein, in the initialization interval, the phase frequency detector is in a disabled state, the control voltage is at a central value in a variable range, and the frequency range tuning circuit outputs the frequency control code to the voltage-controlled oscillator while scanning the frequency control code, monitors corresponding to the frequency control code whether the frequency of the output signal of the voltage-controlled oscillator corresponds to the frequency division ratio which is selected, and detects the frequency control code corresponding to the frequency division ratio which is selected.

4. The frequency synthesizer according to claim 1, further comprising a mode signal generation circuit, which generates a mode signal to switch the frequency control code memory from write mode to read mode when the frequency control code is detected corresponding to all selectable frequency division ratios in the initialization interval, wherein in response to switching of the mode signal to read mode, the phase frequency detector enters an enabled state.

5. The frequency synthesizer according to claim 2, further comprising an initial phase adjustment circuit, which, in the normal operation interval, puts the frequency divider into the disabled state in response to the frequency selection signal, and thereafter, in response to a phase-comparison subjected edge of the reference input signal, puts the frequency divider into the enabled state and causes the frequency divider to start outputting the frequency-divided output signal.

6. The frequency synthesizer according to claim 5, wherein the initial phase adjustment circuit, after putting the frequency divider into an enabled state in response to the frequency selection signal, puts the phase frequency detector into an enabled state after detecting both of a phase-comparison subjected edge of the reference input signal and a phase-comparison subjected edge of the frequency-divided output signal, and causes phase-comparison operation of the phase frequency detector to start.

7. The frequency synthesizer according to claim 1, wherein the phase frequency detector detects a phase difference between a phase-comparison subjected edge of the reference input signal and a phase-comparison subjected edge of the frequency-divided output signal, and outputs the phase difference signal.

8. The frequency synthesizer according to claim 5, wherein the frequency divider, upon entering the enabled state, starts counting of the output signal of the voltage-controlled oscillator, and each time a count value corresponding to the frequency division ratio which is selected is reached, outputs the frequency-divided output signal.

9. The frequency synthesizer according to claim 5, wherein the frequency divider, upon entering an enabled state, starts counting of the output signal of the voltage-controlled oscillator, repeats counting operation until a count value corresponding to the frequency division ratio which is selected is reached, and each time the count value reaches any count value other than a value at a start of counting or a value of counting corresponding to the frequency division ratio, outputs the frequency-divided output signal.

10. A frequency synthesizer comprising:
a voltage-controlled oscillator which oscillates signals at a frequency according to a control voltage;
a frequency divider which divides the frequency of an output signal of voltage-controlled oscillator and for which a frequency division ratio is variably-set at a ratio selected from among a plurality of frequency division ratios in response to a frequency selection signal;
a phase frequency detector which compares a phase of a reference input signal having a standard frequency with a phase of a frequency-divided output signal of the frequency divider and outputs a phase difference signal;
a control voltage generation unit which generates the control voltage according to the phase difference signal;
a frequency range tuning circuit which detects a frequency control code that sets a voltage-controlled frequency range of the voltage-controlled oscillator corresponding to the frequency division ratio which is variably-set; and
a frequency control code memory which stores the frequency control code detected by the frequency range tuning circuit corresponding to the frequency division ratio; and
wherein in an initialization interval, the frequency range tuning circuit detects a plurality of frequency control codes which are detected; and
in a normal operation interval, one of the plurality of frequency control codes is output to the voltage-controlled oscillator selectively in response to the frequency selection signal;
wherein a first frequency control code among the plurality of frequency control codes is changed to a second frequency control code among the plurality of frequency control codes without the initialization interval.

11. A frequency synthesizer comprising:
a voltage-controlled oscillator which oscillates signals at a frequency according to a control voltage;
a frequency divider which divides the frequency of an output signal of the voltage-controlled oscillator and for which a frequency division ratio is variably-set at a ratio selected from among a plurality of frequency division ratios in response to a frequency selection signal;
a phase frequency detector which compares a phase of a reference input signal having a standard frequency with a phase of a frequency-divided output signal of the frequency divider and outputs a phase difference signal;
a control voltage generation unit which generates the control voltage according to the phase difference signal;
a frequency range tuning circuit which detects a frequency control code that sets a voltage-controlled frequency range of the voltage-controlled oscillator corresponding to the frequency division ratio which is variably-set; and
a frequency control code memory which stores the frequency control code detected by the frequency range tuning circuit corresponding to the frequency division ratio; and
a selector to select one of the plurality of frequency control codes in response to the frequency selection signal;
wherein in an initialization interval, the frequency range tuning circuit detects a plurality of frequency control codes which corresponds to the plurality of frequency division ratios respectively, and the frequency control code memory stores the plurality of frequency control codes which are detected; and
in a normal operation interval, one of the plurality of frequency control codes is output to the voltage-controlled oscillator selectively is response to the frequency selection signal.

* * * * *

UNITED STATES PATENT AND TRADEMARK OFFICE
CERTIFICATE OF CORRECTION

| | | |
|---|---|---|
| PATENT NO. | : 8,138,842 B2 | Page 1 of 1 |
| APPLICATION NO. | : 12/560118 | |
| DATED | : March 20, 2012 | |
| INVENTOR(S) | : Masafumi Kondou et al. | |

It is certified that error appears in the above-identified patent and that said Letters Patent is hereby corrected as shown below:

Title Page -

Item (73), Assignee, please correct the Assignee's information to read as follows:

--Fujitsu Limited, Kawasaki (JP)--

Signed and Sealed this
Thirteenth Day of November, 2012

David J. Kappos
*Director of the United States Patent and Trademark Office*